US006153472A

United States Patent [19]

Ding et al.

[11] Patent Number: 6,153,472

[45] Date of Patent: Nov. 28, 2000

[54] METHOD FOR FABRICATING A FLASH MEMORY

[75] Inventors: Yen-Lin Ding, Hsinchu; Gary Hong, Hsin-Chu, both of Taiwan

[73] Assignee: United Semiconductor Corp., Hsinchu, Taiwan

[21] Appl. No.: 09/241,544

[22] Filed: Feb. 1, 1999

[30] Foreign Application Priority Data

Dec. 24, 1998 [TW] Taiwan ................................ 87121610

[51] Int. Cl.[7] ................................................ H01L 21/8247

[52] U.S. Cl. .......................... 438/264; 438/296; 438/594

[58] Field of Search .................................... 438/257, 260, 438/264, 296, 592, 593, 594, 595, 596, 657

[56] References Cited

U.S. PATENT DOCUMENTS 5,387,534 2/1995 Prall ........................................ 438/296
5,646,059 7/1997 Sheu et al. .............................. 438/264
5,696,019 12/1997 Chang .................................... 438/264

*Primary Examiner*—Chandra Chaudhari
*Attorney, Agent, or Firm*—J.C. Patents; Jiawei Huang

[57] ABSTRACT

A method for fabricating a flash memory is provided. The method contains sequentially forming a tunneling oxide layer, a polysilicon layer, and a silicon nitride layer on a semiconductor substrate. Patterning the silicon nitride layer, polysilicon layer, the tunneling oxide layer, and the substrate forms a trench in the substrate. A shallow trench isolation (STI) structure is formed to fill the trench up the silicon nitride layer. The silicon nitride layer is removed to expose the polysilicon layer and a portion of each sidewall of the STI structure. A polysilicon spacer is formed on each exposed sidewall of the STI structure. An upper portion of the STI structure is removed so as to expose a portion of each sidewall of the polysilicon layer. The polysilicon layer serves as a floating gate. A conformal dielectric layer and a top polysilicon layer are formed over the substrate. The top polysilicon layer, the dielectric layer, and the polysilicon layer are patterned to form a strip control gate, which covers the floating gate, that is a remaining portion of the polysilicon layer on the tunneling oxide layer.

20 Claims, 5 Drawing Sheets

METHOD FOR FABRICATING A FLASH MEMORY

CROSS-REFERENCE TO RELATED APPLICATION

This application claims the priority benefit of Taiwan application serial no. 87121610, filed Dec. 24, 1998, the full disclosure of which is incorporated herein by reference.

BACKGROUND OF THE INVENTION

1. Field of the Invention

This invention relates to semiconductor fabrication, and more particularly to a method for fabricating a flash memory device with a high memory cell density.

2. Description of Related Art

Recently, a flash memory with a high memory cell density has significant applications in various apparatus designs. One main advantage of the flash memory is that each memory cell can be fabricated in a greatly reduced dimension, and fabrication cost is also greatly reduced. In a conventional flash memory, memory cells are isolated by a field oxide (FOX) structure that is formed by local oxidation (LOCOS). The FOX structure has its lower limitation of dimension. This causes the cell density is limited also.

Another typical isolation structure is a shallow trench isolation (STI) structure. Since the STI structure can be formed in a much less dimension than that of the FOX structure. An application of the STI structure in a flash memory can effectively minimize the cell dimension so that the cell density can be ultimately increased.

However, in this manner, an overlapping area between a floating gate and a control gate of the flash memory is accordingly small. This causes a smaller coupling ratio. A smaller coupling ratio causes a need of a higher bias applied on the control gate during erasing the information stored in the memory cells. Moreover, the flash memory with a smaller coupling ratio needs a higher electric field to obtain a Fowler-Nordheim (F-N) tunneling effect, and results in a less electron transmission rate between the floating gate and a source/drain region. The read/write manner therefore becomes slower. All above problems are induced by a less coupling ratio, which further results from a too small dimension. The dimension of the flash memory cell again cannot be further reduced. It is a goal to fabricate a flash memory having high cell density and large coupling rate.

SUMMARY OF THE INVENTION

It is therefore an objective of the present invention to provide a method for fabricating a flash memory so as to obtain a greater cell density and a larger coupling ratio. The fabrication cost can be reduced, and the read/write performance is improved.

In accordance with the foregoing and other objectives of the present invention, an improved method for fabricating a flash memory is provided. The improved method includes sequentially forming a tunneling oxide layer, a polysilicon layer, and a silicon nitride layer on a semiconductor substrate. Patterning the silicon nitride layer, polysilicon layer, the tunneling oxide layer, and the substrate forms a shallow trench in the substrate. A liner oxide layer is formed on each side wall of the trench, the tunneling oxide layer, and the polysilicon layer. A shallow trench isolation (STI) structure is formed to fill the trench up the silicon nitride layer. The silicon nitride layer is removed to expose the polysilicon layer and a portion of each sidewall of the STI structure, in which the polysilicon is to be further simultaneously patterned later to form a floating gate. A polysilicon spacer is formed on each exposed sidewall of the STI structure. The polysilicon spacer provides more overlapping area between a control gate and a floating gate. An upper portion of the STI structure is removed to fully expose the polysilicon spacer except its bottom on the polysilicon layer and a portion of each sidewall of the polysilicon layer. The exposed portion of each sidewall of the polysilicon further provides more overlapping area. As a result, the coupling ratio is maintained sufficiently large. A conformal dielectric layer and a top polysilicon layer are formed over the substrate. The top polysilicon layer, the dielectric layer, and the polysilicon layer are patterned to form a strip control gate, which covers the floating gate, that is a remaining portion of the polysilicon layer on the tunneling oxide layer. An interchangeable source/drain region is formed in the substrate at active area at each side of the floating gate.

In the foregoing, the polysilicon layer is simultaneously pre-patterned during the formation of the shallow trench, and is simultaneously further patterned during the formation of the control gate. There is no need of an extra photolithography process to pattern the polysilicon layer. Fabrication process is simplified. The polysilicon spacer and the exposed portion of each sidewall of the polysilicon provide more overlapping area between the floating gate and the control gate. The coupling ratio is maintained sufficiently high.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
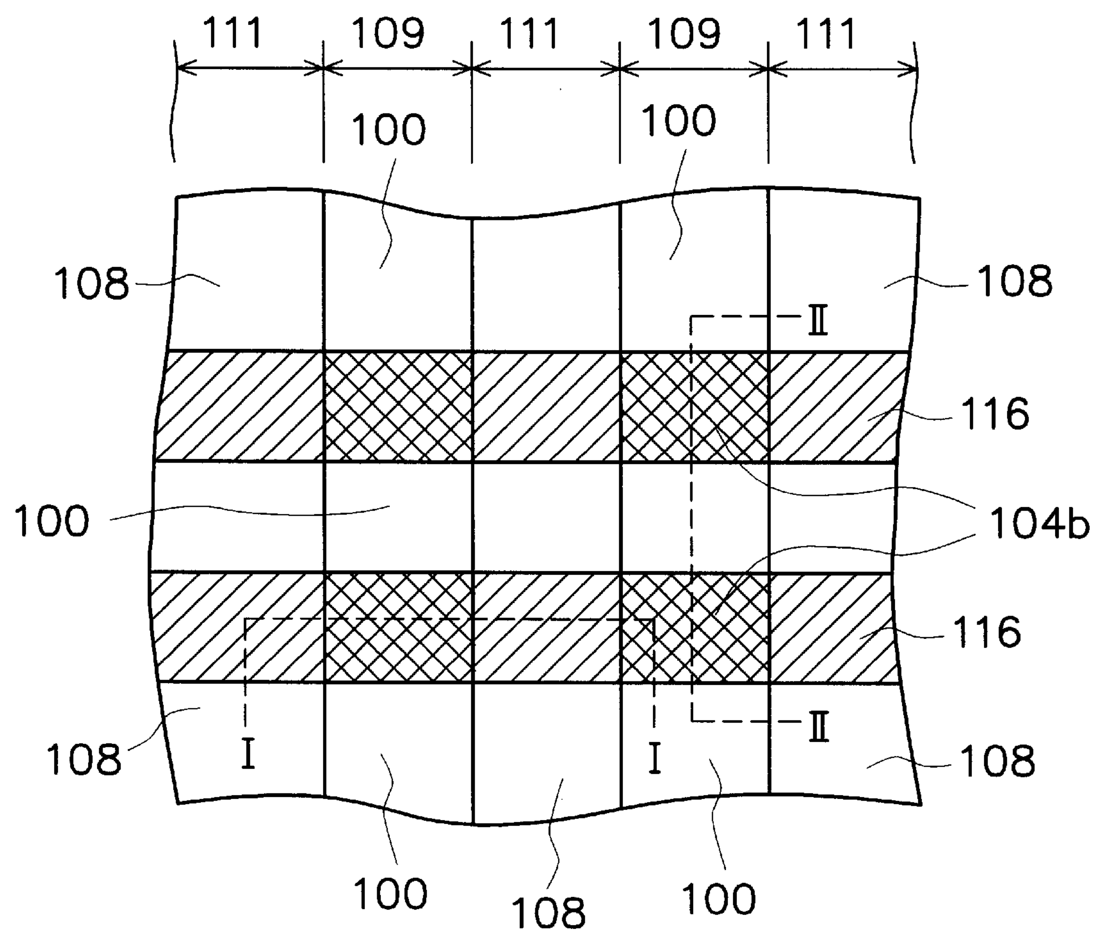
FIG. 1 is a top view of a portion of a substrate, schematically illustrating a structure of a flash memory with a NAND structure, according a preferred embodiment of the invention.

FIG. 1 is a top view of a portion of a substrate, schematically illustrating a structure of a flash memory with a non-AND gate (NAND) structure, according a preferred embodiment of the invention. In FIG. 1, a shallow trench 108 is formed in a semiconductor substrate 100. An active area 109 is simultaneously defined. The shallow trench 108 is filled with insulating material, such as oxide, to form a shallow trench isolation (STI) structure 11. A detail structure is described in FIGS. 2A–2H.

Figure 2A:
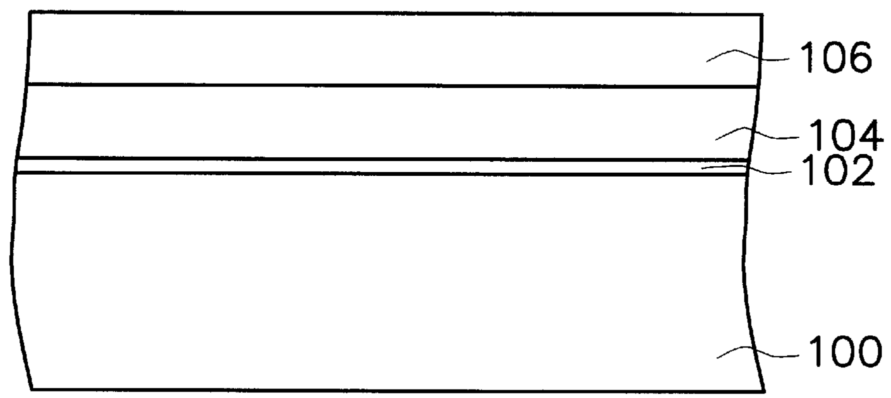
FIGS. 2A–2H are cross-sectional views of a portion of the substrate taken along a line I—I in FIG. 1, schematically illustrating a fabrication process to form a flash memory, according to a preferred embodiment of the invention.

FIGS. 2A–2H are cross-sectional views of a portion of the substrate taken along a line I—I in FIG. 1, schematically illustrating a fabrication process to form a flash memory, according to a preferred embodiment of the invention. In FIG. 2A, there is a semiconductor substrate 100. A tunneling oxide layer 102 is formed on the substrate 100 by, for example, thermal oxidization. A polysilicon layer 104 is formed on the tunneling oxide layer 102 by, for example, chemical vapor deposition (CVD). A mask layer 106 including, for example, silicon nitride is formed on the polysilicon layer 104 by, for example, CVD. As to be seen, the polysilicon layer 104 is to be automatically patterned to form a floating gate during a formation of a control gate.

Figure 2B:
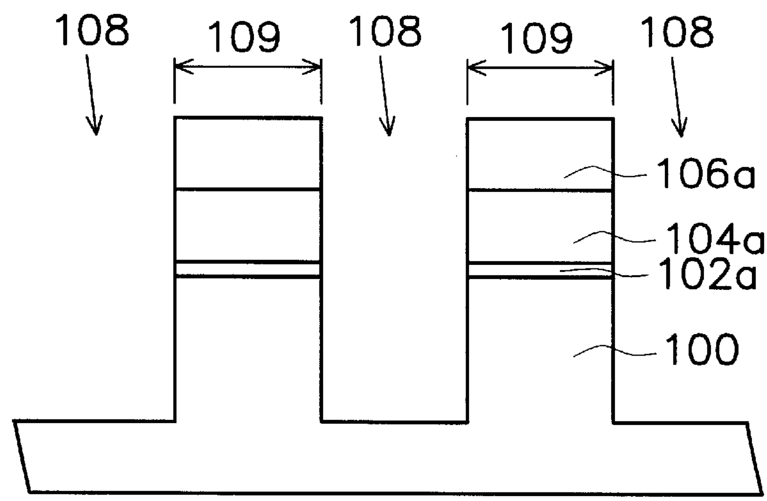

In FIG. 2B, the mask layer 106, the polysilicon layer 104, the tunneling oxide layer 102, and the substrate 100 are patterned by, for example, photolithography and etching to form a shallow trench 108 in the substrate 100. An active area 109 is automatically defined. Remaining portions of the mask layer 106, the polysilicon layer 104, and the tunneling oxide layer 102 respectively become a the mask layer **106*a*, a polysilicon layer 104*a*, and a tunneling oxide layer 102*a*. During the formation of the shallow trench 108, the polysilicon layer 104** is simultaneously pre-patterned. One photolithography process is skipped. Fabrication time and fabrication cost are reduced.

Figure 2C:
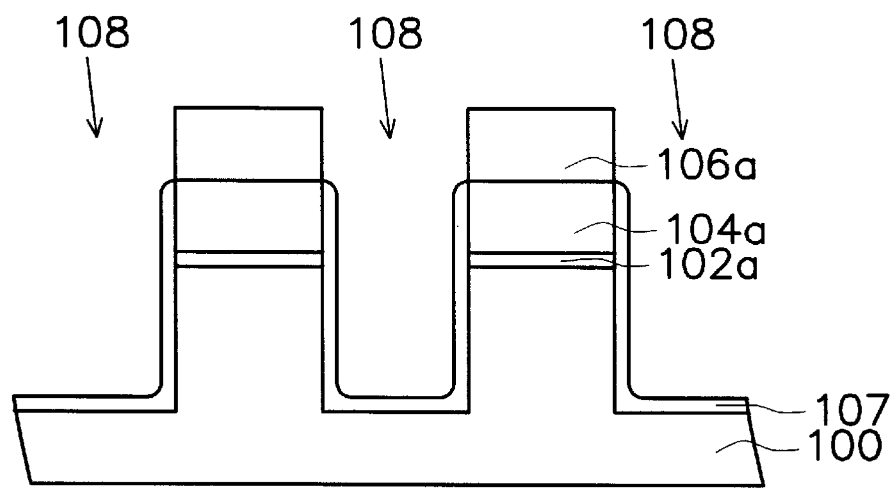

In FIG. 2C, a liner oxide layer 107 is formed by, for example, thermal oxidation, on each sidewall of the trench 108, the tunneling oxide layer **102*a*, and the polysilicon layer 104*a*. The purpose of the liner oxide layer 107 is to recover the damaged substrate 100** and to increase an adhesion capability for subsequently filled STI material, such silicon oxide.

Figure 2D:
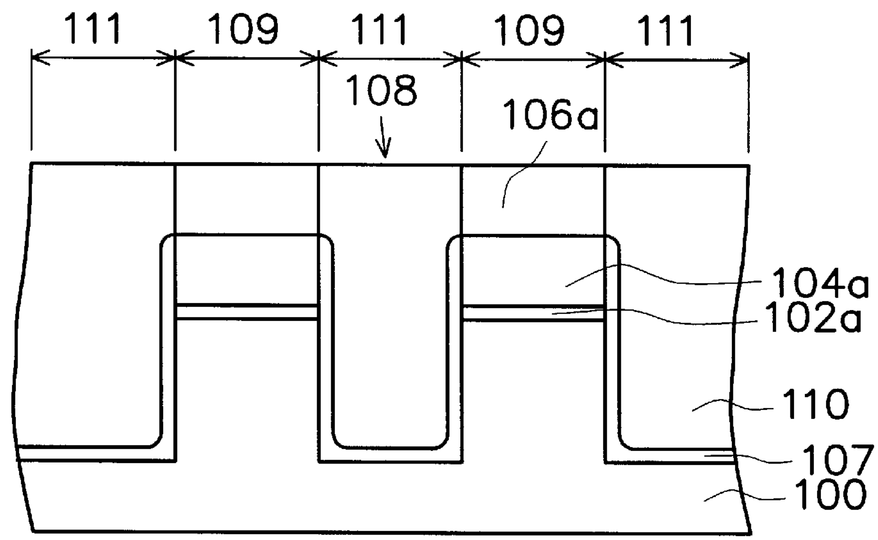

In FIG. 2D, an silicon oxide layer is formed over the substrate 100 to at least fill the trench 108 up the mask layer **106*a*. A planarization process, such as a chemical mechanical polishing (CMP) process with a polishing stop point at the mask layer 106*a*, is performed to planarize the silicon oxide layer so that the mask layer 106*a* is exposed. A remaining portion of the silicon oxide layer becomes a silicon oxide layer 110 that fills the trench 108 up to a height of the mask layer 106*a*. The silicon oxide layer 110 and the liner oxide layer 107 form together as a STI structure 111**.

Figure 2E:
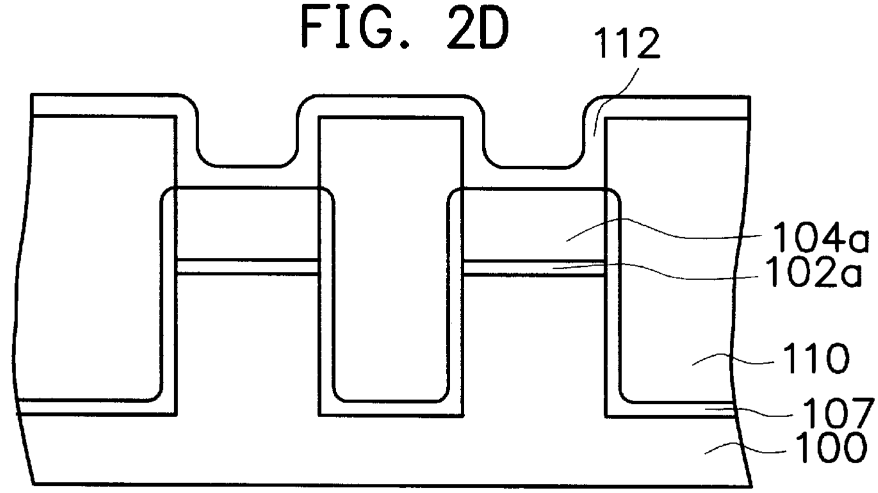

In FIG. 2E, the mask layer **106*a* is removed by, for example, wet etching so that the polysilicon layer 104*a* is exposed. A top portion of the STI structure 111 is also exposed. A conformal polysilicon layer 112 is formed on a current top surface over the substrate 100. The formation of the polysilicon layer 112** includes, for example, CVD.

Figure 2F:
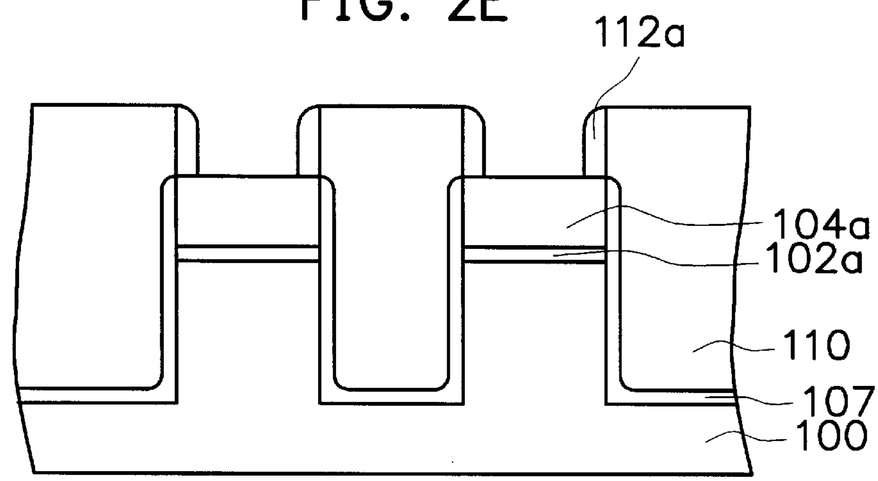

In FIG. 2F, an etching back process is performed to remove the polysilicon layer 112. A remaining portion of the polysilicon layer 112 forms a polysilicon spacer **112*a* on each sidewall of the STI structure 111 at the exposed portion. The polysilicon spacer 112*a* sitting on the polysilicon layer 104*a* is used to provide more overlapping area with a control gate that is to be formed later. The polysilicon layer 104*a* and the polysilicon spacer 112*a* serve together as a floating gate. The coupling ratio is effectively increased due to the polysilicon spacer 112*a***.

Figure 2G:
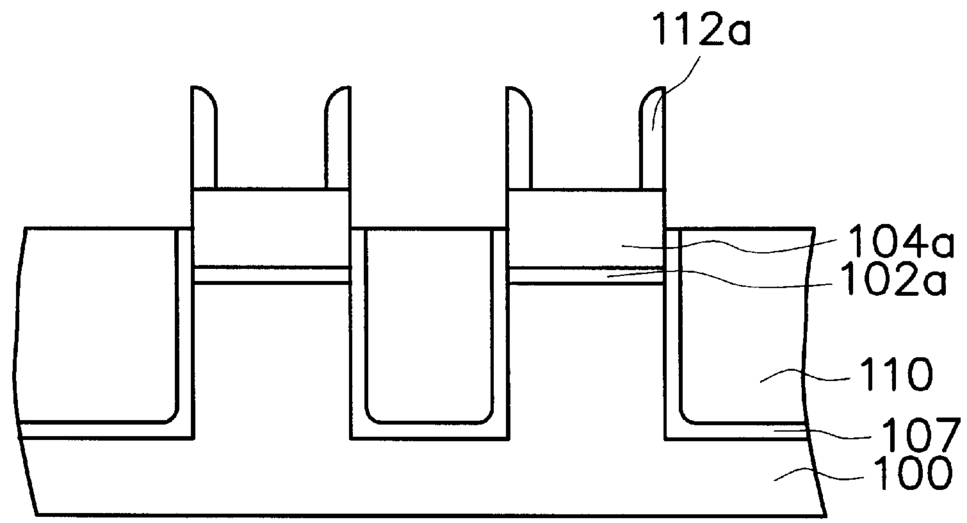

In FIG. 2G, a top portion of the STI structure 111 is removed by, for example, dry etching or wet etching until a portion of each sidewall of the polysilicon layer **104*a* is exposed. As a result, a top portion of the silicon oxide layer 110 and a top portion of the liner oxide layer 107 are removed but they still remain at a certain height above the tunneling oxide layer 102*a*. Each sidewall of the polysilicon spacer 112*a* is exposed. Moreover, the exposed portion of each sidewall of the polysilicon layer 104*a*** further provides the overlapping area. The coupling ratio is further increased.

Figure 2H:
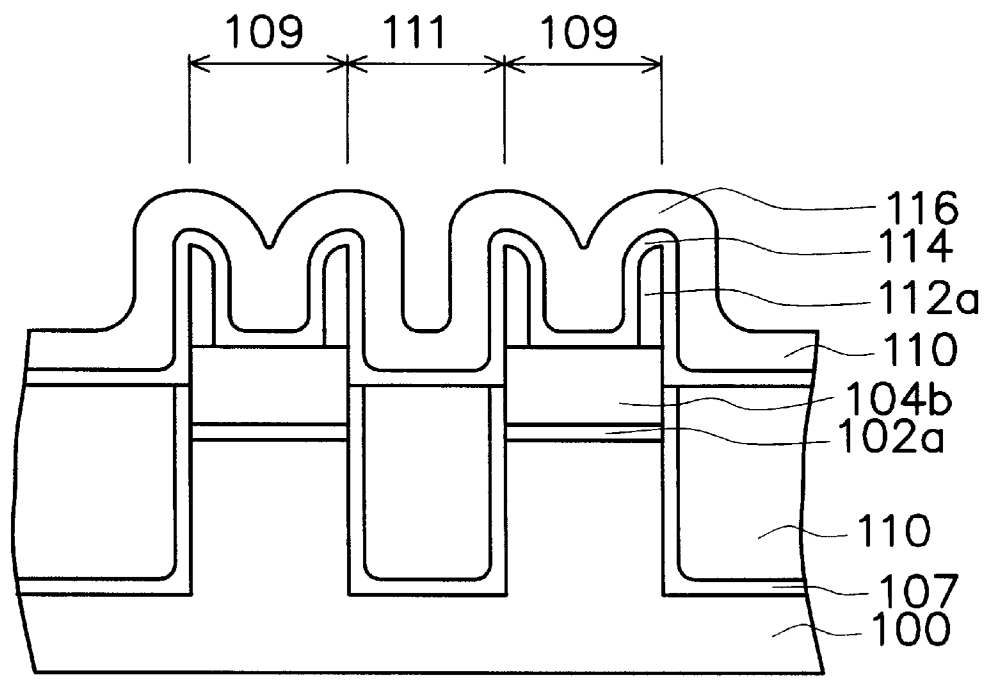

In FIG. 2H, a conformal dielectric layer 114 is formed over the substrate 100 to cover the silicon oxide layer 110, the liner oxide layer 114, the polysilicon spacer **112*a*, and the polysilicon layer 104*a*. The dielectric layer 114** includes, for example, an oxide/nitride/oxide (O/N/O) structure, which is formed by, for example, CVD.

Figure 3:
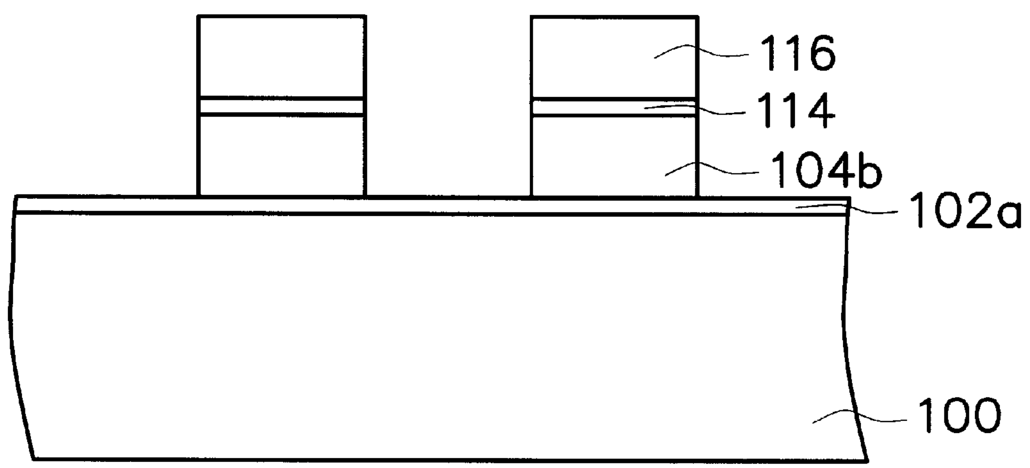
FIG. 3 is a cross-sectional view of a portion of the substrate taken along a line II—II in FIG. 1, schematically illustrating the structure of the flash memory, according to a preferred embodiment of the invention.

A polysilicon layer 116 is formed on the dielectric layer by CVD. The polysilicon layer 116 is patterned to form a control gate structure with a strip structure as can be seen in FIG. 1 with a shaded strip region, which is about vertically across the active area 109. The patterning process with same pattern mask is continuously performed to at least pattern the dielectric layer 114, the polysilicon spacer **112*a*, and the polysilicon layer 104*a* to exposes the tunneling oxide layer 102*a*. The polysilicon layer 104*a* becomes polysilicon 104*b*. This patterning effect can be seen in another cross section view. FIG. 3 is a cross-sectional view of a portion of the substrate taken along a line II—II in FIG. 1, schematically illustrating the structure of the flash memory, according to a preferred embodiment of the invention. In FIG. 3, the polysilicon layer 116 serves as the control gate, and the polysilicon layer 104*b* serves as the floating gate. The polysilicon layer 104*b* cover a portion of the substrate 100 within the active region 109 of FIG. 1. The polysilicon spacer 112*a*** is not shown in this cross-sectional view.

An ion implantation process is performed to from an interchangeable source/drain region in the substrate at each side of the polysilicon layer **104*b***, that is, the floating gate. The flash memory device is formed. The rest fabrication processes are well known by the one skilled in the art, and are not further described here.

In conclusion, the method, according to the invention, to form a flash memory has several characteristics as follows:

1. The invention uses STI structure as a isolation structure. The device integration can greatly increase. The polysilicon spacer **112*a* provides more overlapping area between the floating gate 104*b* and the control gate 116** so that the coupling ratio is maintained sufficiently large. The operation speed of the flashing memory is maintained high.
2. The polysilicon layer 104 is simultaneously patterned during the formation of the STI structure, in which at least one photolithography process is saved, and the formation of the polysilicon layer 116 with a strip structure. The fabrication process is simplified, fabrication cost and time are reduced.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a flash memory, the method comprising:

forming a tunneling oxide layer on a semiconductor substrate;

forming a first polysilicon player on the tunneling oxide layer;

forming a mask layer on the first polysilicon layer;

patterning the mask layer, the polysilicon layer, the tunneling oxide layer, and the substrate to form a trench in the substrate so that an active area other than the trench is simultaneously formed, in which the active area comprises a strip structure along a first direction;

forming a liner oxide layer on each sidewall of the trench, the tunneling oxide layer and the first polysilicon layer;

filling the trench with insulating material up to the mask layer so as to form together with the liner oxide layer as a shallow trench isolation (STI) structure in the trench;

removing the mask layer to exposed a portion of each sidewall of the STI structure and a top surface of the first polysilicon layer;

forming a polysilicon spacer on the exposed portion of each sidewall of the STI structure;

removing a top portion of the STI structure to further expose the polysilicon spacer at a side originally covered by the STI structure, and a top portion of each sidewall of the first polysilicon layer;

forming a conformal dielectric layer over the substrate;

forming a second polysilicon layer on the dielectric layer;

patterning at least the second polysilicon layer, the dielectric layer, the polysilicon spacer, the first polysilicon layer to form a control gate with a strip structure, which is about vertically across the expose active area, wherein the tunneling oxide layer is according exposed, and the patterned first polysilicon layer, and the patterned polysilicon spacer serve together as a floating gate; and doping the substrate to form an interchangeable source/drain region in the active area at each side of the floating gate.

2. The method of claim 1, wherein the mask layer comprises silicon nitride.

3. The method of claim 1, wherein the step of forming the tunneling oxide layer comprises thermal oxidation.

4. The method of claim 1, wherein the steps of forming the first polysilicon layer and the second polysilicon layer comprise CVD.

5. The method of claim 1, wherein the step of patterning the mask layer, the polysilicon layer, the tunneling oxide layer, and the substrate comprises photolithography and etching.

6. The method of claim 1, wherein the step of filling the trench with insulating material up to the mask layer comprises:

depositing an insulating layer over the substrate; and performing a planarization process to remove the insulation layer so that a remaining port of the insulating layer forms the STI structure to fill the trench up to the mask layer.

7. The method of claim 6, wherein the planarization process comprises chemical mechanical polishing (CMP) process.

8. The method of claim 1, wherein the step of forming the polysilicon spacer comprises:

forming a conformal polysilicon layer over the substrate; and performing an etching back process to remove the conformal polysilicon layer so that a remaining portion of the conformal polysilicon layer forms the polysilicon spacer.

9. The method of claim 1, wherein the step of forming the conformal dielectric layer comprises a formation to comprises an oxide/nitride/oxide (O/N/O) structure.

10. The method of claim 1, wherein the step of forming the conformal dielectric layer comprises CVD.

11. The method of claim 1, wherein the step of patterning at least the second polysilicon layer, the dielectric layer, the polysilicon spacer, the first polysilicon layer comprises photolithography and etching.

12. The method of claim 1, wherein the step of forming the liner oxide layer comprises thermal oxidation.

13. A method for fabricating a flash memory on a semiconductor substrate, which comprises a tunneling oxide layer, a first polysilicon player and a mask layer sequentially formed on a top, the method comprising:

patterning the mask layer, the polysilicon layer, the tunneling oxide layer, and the substrate to form a trench in the substrate so that an active area other than the trench is simultaneously formed, in which the active area comprises a strip structure along a first direction;

filling the trench with insulating material up to the mask layer so as to form a shallow trench isolation (STI) structure in the trench;

removing the mask layer to exposed a portion of each sidewall of the STI structure and a top surface of the first polysilicon layer;

forming a polysilicon spacer on the exposed portion of each sidewall of the STI structure;

removing a top portion of the STI structure to further expose the polysilicon spacer at a side originally covered by the STI structure, and a top portion of each sidewall of the first polysilicon layer;

forming a conformal dielectric layer over the substrate;

forming a second polysilicon layer on the dielectric layer;

patterning at least the second polysilicon layer, the dielectric layer, the polysilicon spacer, the first polysilicon layer to form a control gate with a strip structure, which is about vertically across the expose active area, wherein the tunneling oxide layer is according exposed, and the patterned first polysilicon layer and the patterned polysilicon spacer form together as a floating gate; and performing an ion implantation process to form an interchangeable source/drain region in the active area at each side of the floating gate.

14. The method of claim 13, wherein the mask layer comprises silicon nitride.

15. The method of claim 13, wherein the step of forming the tunneling oxide layer comprises thermal oxidation.

16. The method of claim 13, wherein the steps of forming the first polysilicon layer and the second polysilicon layer comprise CVD.

17. The method of claim 13, wherein the step of patterning the mask layer, the polysilicon layer, the tunneling oxide layer, and the substrate comprises photolithography and etching.

18. The method of claim 13, wherein the step of filling the trench with insulating material up to the mask layer comprises:

depositing an insulating layer over the substrate; and performing a planarization process to remove the insulation layer so that a remaining port of the insulating layer forms the STI structure to fill the trench up to the mask layer.

19. The method of claim 13, wherein the step of forming the polysilicon spacer comprises:

forming a conformal polysilicon layer over the substrate; and performing an etching back process to remove the conformal polysilicon layer so that a remaining portion of the conformal polysilicon layer forms the polysilicon spacer.

20. The method of claim 13, wherein the step of forming the conformal dielectric layer comprises a formation of an oxide/nitride/oxide (O/N/O) structure.

* * * * *